(12) United States Patent
Kwon

(10) Patent No.: US 12,352,816 B2
(45) Date of Patent: Jul. 8, 2025

(54) METHOD AND APPARATUS FOR AUTOMATICALLY DETECTING NUMBER OF BATTERY PACKS IN ESS

(71) Applicant: Elentec., LTD, Hwaseong-si (KR)

(72) Inventor: Han Yong Kwon, Hwasung-si (KR)

(73) Assignee: Elentec., LTD, Hwaseong-si (KR)

( * ) Notice: Subject to any disclaimer, the term of this patent is extended or adjusted under 35 U.S.C. 154(b) by 105 days.

(21) Appl. No.: 18/070,524

(22) Filed: Nov. 29, 2022

(65) Prior Publication Data

US 2023/0408590 A1    Dec. 21, 2023

(30) Foreign Application Priority Data

Jun. 20, 2022   (KR) .................. 10-2022-0075059

(51) Int. Cl.
*G01R 31/3835*        (2019.01)
*H02J 7/00*           (2006.01)

(52) U.S. Cl.
CPC ...... *G01R 31/3835* (2019.01); *H02J 7/00032* (2020.01); *H02J 7/0014* (2013.01); *H02J 7/0047* (2013.01)

(58) Field of Classification Search
CPC .... H02J 7/0032; H02J 7/0014; G01R 31/3835
See application file for complete search history.

(56) References Cited

U.S. PATENT DOCUMENTS

| | | | |
|---|---|---|---|
| 2010/0173180 A1* | 7/2010 | Li | B60L 58/18 |
| | | | 429/61 |
| 2022/0311064 A1* | 9/2022 | Hwang | H01M 10/425 |
| 2024/0047807 A1* | 2/2024 | Gao | H01M 50/249 |

* cited by examiner

*Primary Examiner* — Christopher E Mahoney
(74) *Attorney, Agent, or Firm* — Revolution IP, PLLC

(57) ABSTRACT

Proposed is a method and an apparatus for automatically detecting the number of battery packs in an ESS. According to an embodiment of the present disclosure, the method includes calculating the number of analog front-ends (AFEs) through measurement of voltage of an entire ESS, confirming the number of AFEs using serial communication with the AFEs, determining whether the number of AFEs calculated through the measurement of voltage of the entire ESS and the number of AFEs determined through the serial communication with the AFEs are the same, and when the number of AFEs calculated through the measurement of voltage of the entire ESS and the number of AFEs confirmed through the serial communication with the AFEs are the same, calculating the number of battery packs using the number of AFEs.

12 Claims, 3 Drawing Sheets

METHOD AND APPARATUS FOR AUTOMATICALLY DETECTING NUMBER OF BATTERY PACKS IN ESS

CROSS REFERENCE TO RELATED APPLICATION

The present application claims priority to Korean Patent Application No. 10-2022-0075059, filed Jun. 20, 2022, the entire contents which is incorporated herein for all purposes by this reference.

BACKGROUND OF THE INVENTION

Field of the Invention

The present disclosure relates to a method and an apparatus for automatically detecting the number of battery packs and, more particularly, to a method and an apparatus configured to automatically detect the number of battery packs included in an energy storage system (ESS).

Description of the Related Art

Recently an energy storage system (ESS), which is also referred to as an energy storage apparatus that stores produced electricity and supplies same when electricity is needed is widely used.

Such ESSs may supply power by combining with renewable energy sources such as solar energy, wind power, and the like, and have an advantage of being able to provide electricity that is stored when electricity rates are low to be used at peak times.

In addition, even in a power outage situation, when energy previously charged with the ESS is used, people may receive power without major problems in daily life. Accordingly, recently, the ESS has been actively used not only in industrial fields but also in households.

The ESS allows electricity to be stored and used when needed generally by using a device called a battery pack including a plurality of batteries or a battery.

In particular, in the case of a battery pack that allows electrical energy finally to be output, the number of battery packs is generally determined in advance and produced.

However, as the range and purpose of the ESS have recently been diversified and the configuration of the ESS has become more complex and diversified, the internal configuration of the ESS is being modularized to cope with this. In particular, the number of packs included inside the ESS is also not limited only to a preset number but is allowed to be configured in a variable manner.

That is, although many ESS devices physically appear identical on the outside, there are cases in which one ESS has 3 battery packs, and another ESS has 4 battery packs depending on its use or purpose, for example.

When the number of battery packs included inside the ESS changes, the amount of electricity storage, output, the performance or control of the ESS change. In this context, it is very important to accurately determine the number of battery packs in the ESS.

However, when the ESS is assembled, it is difficult to determine the exact number of battery packs until the ESS is disassembled.

In addition, even the number of battery packs is identified and recorded during the manufacturing process, the number of battery packs may be incorrectly recorded due to misunderstandings or errors in a manufacturing process, thereby causing many problems in a process of using the ESS.

Therefore, it is required to allow the number of battery packs of the ESS to be automatically and accurately detected.

In addition, it is required to accurately and automatically detect the number of battery packs of the ESS so that the number of battery packs of the ESS may be verified even without disassembling the ESS.

The foregoing is intended merely to aid in the understanding of the background of the present disclosure and is not intended to mean that the present disclosure falls within the purview of the related art that is already known to those skilled in the art.

SUMMARY OF THE INVENTION

Accordingly, the present disclosure has been made keeping in mind the above problems occurring in the related art, and an objective of the present disclosure is to provide a method and an apparatus for automatically detecting the number of battery packs in an ESS that make the number of battery packs in the ESS automatically and accurately detected so that various types of the ESS may be manufactured.

In addition, another objective of the present disclosure is to provide the method and the apparatus for automatically detecting the number of battery packs in an ESS that make the number of battery packs in the ESS automatically and accurately detected so that the number of battery packs in the ESS may be verified even without disassembling the ESS.

Other objectives of the present disclosure will be easily understood through the description of the following embodiments.

In order to achieve the above objectives, according to one aspect of the present disclosure, there may be provided a method for automatically detecting the number of battery packs in an ESS.

According to an exemplary embodiment of the present disclosure, the method includes: calculating the number of analog front-ends (AFEs) through measurement of voltage of an entire ESS; confirming the number of AFEs using serial communication with the AFEs; determining whether the number of AFEs calculated through the measurement of voltage of the entire ESS and the number of AFEs determined through the serial communication with the AFEs are the same; and when the number of AFEs calculated through the measurement of voltage of the entire ESS and the number of AFEs confirmed through the serial communication with the AFEs are the same, calculating the number of battery packs using the number of AFEs.

When the number of AFEs calculated through the measurement of voltage of the entire ESS and the number of AFEs confirmed through the serial communication with the AFEs are not the same, it may be performed again from a step of calculating the number of AFEs through the measurement of voltage of the entire ESS.

In addition, when a result of a process performed again from the step of calculating the number of AFEs through the measurement of voltage of the entire ESS shows also that the number of AFEs calculated through voltage measurement of the entire ESS and the number of AFEs confirmed through the serial communication with the AFEs are not the same, it may be determined that the ESS is abnormal.

The battery packs may be interconnected in a daisy chain method.

The AFEs may be each connected to each battery pack and perform at least one of voltage measuring of battery cells, temperature measuring of the battery cells, and output balancing between the battery cells, the battery cells constituting the battery pack.

The serial communication in which the MCU and the AFEs are connected may be a serial peripheral interface (SPI) communication method.

According to the exemplary embodiment of the present disclosure, there may be provided an apparatus for automatically detecting the number of battery packs in an ESS, the apparatus including: an AFE number calculation unit configured to calculate the number of analog front-ends (AFEs) through voltage measurement of voltage of an entire ESS; an AFE number confirmation unit configured to confirm the number of AFEs through serial communication with the AFEs; a determination unit configured to determine whether the number of AFEs calculated by the AFE number calculation unit and the number of AFEs confirmed by the AFE number confirmation unit are the same; and a battery pack number calculation unit configured to calculate the number of battery packs using the number of AFEs when the number calculated by the AFE number calculation unit and the number confirmed by the AFE number confirmation unit are the same, as the result of the determination by the determination unit.

When the number of AFEs calculated by the AFE number calculation unit and the number of AFEs confirmed by the AFE number confirmation unit are not the same, as a result of the determination by the determination unit, it may be performed again from calculating the number of AFEs through the voltage measurement of the entire ESS in the AFE number calculation unit.

In addition, when a result of performing again from the calculating the number of AFEs through the voltage measurement of the entire ESS in the AFE number calculation unit shows also that the number of AFEs calculated by the AFE number calculation unit and the number of AFEs confirmed by the AFE number confirmation unit are not the same, the determination unit may determine that the ESS is abnormal.

The battery packs may be interconnected in a daisy chain method.

the AFEs may be each connected to each battery pack and perform at least one of voltage measuring of battery cells, temperature measuring of the battery cells, and output balancing between the battery cells, the battery cells constituting the battery pack.

The serial communication to which the AFEs are connected may be a serial peripheral interface (SPI) communication method.

As described above, according to the method and the apparatus for automatically detecting the number of battery packs in an ESS according to the present disclosure, the present disclosure is capable of automatically and accurately detecting the number of battery packs in the ESS, thereby having an advantage in that various types of the ESSs can be manufactured.

In addition, the present disclosure has an advantage in that the number of battery packs in the ESS can be verified even without disassembling the ESS.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
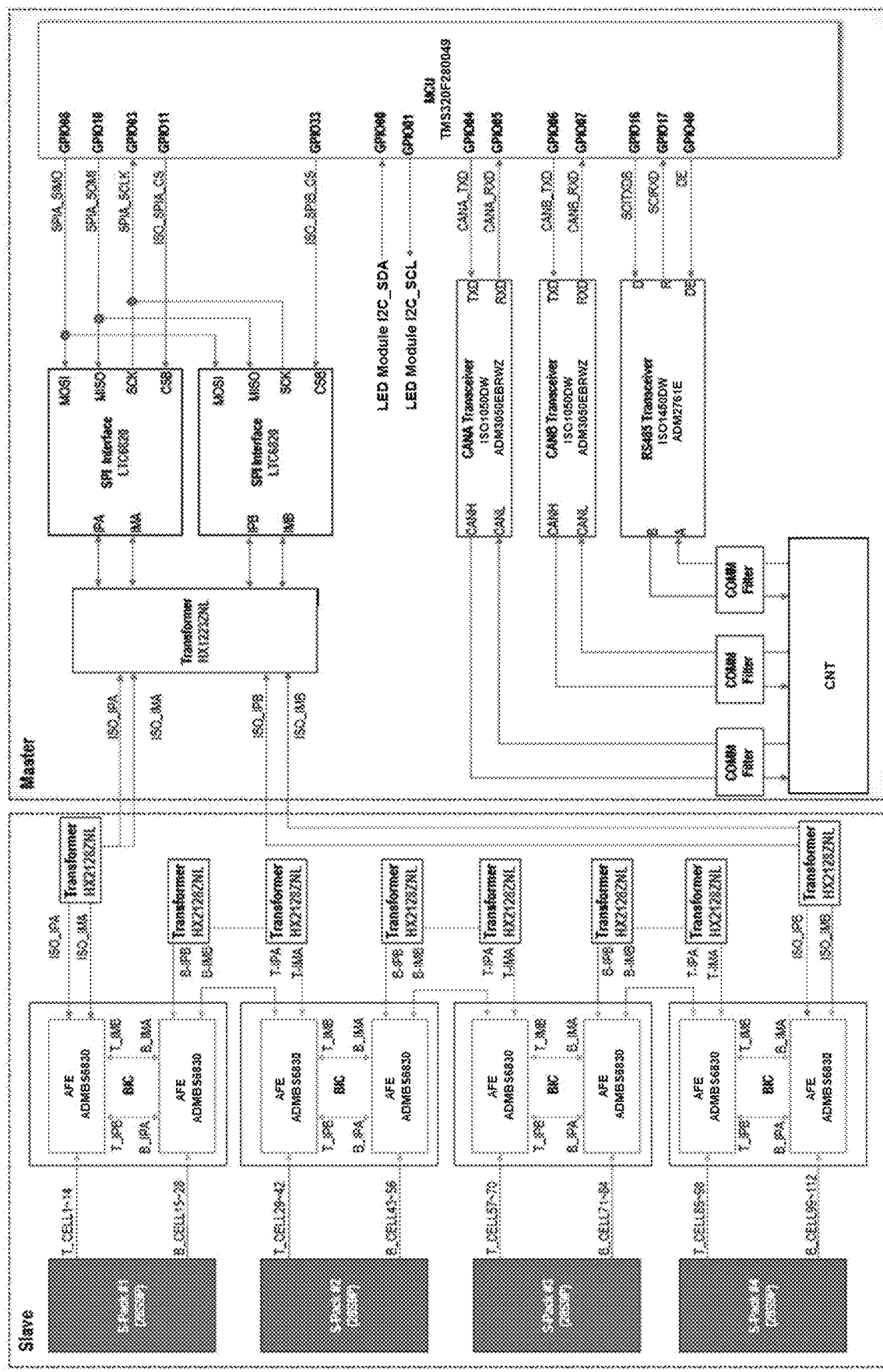
FIG. 1 is an exemplary diagram illustrating a circuit configuration of an ESS to which automatically detecting the number of battery packs in an ESS according to an exemplary embodiment of the present disclosure is applied.

The present disclosure may make various changes and have various embodiments, specific embodiments will be illustrated in the drawings and described in detail in the present specification. However, this is not intended to limit the present disclosure to the specific embodiments and should be understood to include all modifications, equivalents, and substitutes included in the spirit and scope of the present disclosure.

Like reference numerals have been used for like elements throughout the description of each figure. In describing the present disclosure, when it is determined that a detailed description of related known technologies may obfuscate the gist of the present disclosure, the detailed description will be omitted.

Terms such as first and second may be used to describe various elements, but the elements should not be limited by the terms. Such terms are only used for the purpose of distinguishing one element from another.

For example, a first element may be termed a second element, and similarly, a second element may also be termed a first element, without departing from the scope of the present disclosure.

The term "and/or" includes one of any combination of a plurality of related written items or any of a plurality of related written items.

It should be understood that when an element is referred to as being "connected" or "coupled" to another element, it may be directly connected or coupled to another element, but other elements may exist therebetween.

On the other hand, when a component is referred to as "directly connected" or "directly coupled" to another component, it should be understood that no other component exists therebetween.

Terms used in the present application are only used to describe specific embodiments and are not intended to limit the present disclosure.

Singular expressions include plural expressions unless the context clearly indicates otherwise. In the present application, terms "include" or "have" are intended to designate that there is a feature, a number, a step, an operation, a component, part, or a combination thereof described in the specification, but it should be understood that it does not preclude the possibility of the presence or addition of one or more other features, numbers, steps, operations, components, parts, or combinations thereof.

Unless defined otherwise, all terms used herein, including technical or scientific terms, have the same meaning as commonly understood by one of ordinary skill in the art to which the present disclosure belongs.

Terms such as those defined in commonly used dictionaries should be interpreted as having a meaning consistent with the meaning in the context of the related art, and unless explicitly defined in the present application, it is not interpreted in an ideal or excessively formal meaning.

Hereinafter, exemplary embodiments according to the present disclosure will be described in detail with reference to the accompanying drawings, but the same or corresponding elements regardless of reference numerals are assigned the same reference numerals, and redundant descriptions thereof will be omitted.

First, with reference to FIG. 1, a circuit configuration of an ESS to which automatically detecting the number of battery packs in an ESS according to an exemplary embodiment of the present disclosure is applied will be described.

FIG. 1 is an exemplary diagram illustrating a circuit configuration of an ESS to which automatically detecting the number of battery packs in an ESS according to an exemplary embodiment of the present disclosure is applied.

As shown in FIG. 1, the circuit configuration of the ESS to which the automatically detecting the number of battery packs in an ESS according to an exemplary embodiment of the present disclosure is applied may be largely composed of a master part and a slave part, wherein a Micro Control Unit (MCU) is included on a master side and an Analog front-end (AFE) is included on a slave side.

An analog front-end also called an analog front-end controller (AFEC) is an analog signal conditioning circuit that uses analog amplifiers with high sensitivity.

The ESS has battery cells connected to a unit battery pack to constitute a battery pack and allows an AFE diagnosis, wire opening, and the like in addition to voltage measuring of the battery cells, temperature measuring of the battery cells, cell balancing between the battery cells, and the like to be performed.

In particular, the ESS circuit used in the present disclosure may apply ADBMS6830 technology, which is an AFE IC, and connect multiple battery modules in a bi-directional daisy chain method, thereby performing control management of all batteries through a master and slave control structure that is able to communicate even in an event of a wiring short circuit.

That is, a plurality of battery packs is interconnected in the daisy chain method, thereby being enabled bi-directional communication, and the AFE is connected to each of the plurality of battery packs.

In addition, the AFE is connected to the MCU, and the connection between the MCU and the AFE is connected by serial communication and may be connected by Serial Peripheral Interface (SPI) communication.

More specifically, information or signals such as Cell Voltage, Temp, Cell Balancing, AFE Diagnosis, Wire open, and the like, which are information from the slave, may be configured to proceed with two-way International Organization for Standardization (ISO) SPI communication with an LTC6820 SPI Interface IC of the master.

Through such a circuit configuration of ESS, the number of battery packs is allowed to be automatically detected at the MCU.

That is, the method of automatically detecting the number of battery packs according to the present disclosure is performed at the MCU, and an apparatus performing such a method is also the MCU.

Meanwhile, automatically detecting the number of battery packs is, in more detail, confirming first the number of the AFEs through measurement of the voltage of the entire ESSs. Even when the number of battery packs is not precisely known, when various types of the ESSs are manufactured in the same process, the unit battery cells or unit battery packs used in entire ESSs are the same, so the number of AFEs may be confirmed using the unit voltage value of the battery pack.

For example, when the measured output voltage of the ESS is 100V and one battery pack is manufactured to output a voltage of 25V, the number of battery packs is four.

In addition, when each battery pack has two AFEs connected thereto, the total number of AFEs becomes eight.

In this way, first, the number of AFEs may be calculated through only the measurement of the voltage of the entire ESS. Then, the number of AFEs is using serial communication with the AFEs.

As described above, the AFE and the MCU are connected to each other through serial communication, so the ESS used in the present disclosure confirms the number of AFEs using this.

In addition, it is determined whether the number of AFEs calculated through the voltage measurement of the entire ESS and the number of AFEs confirmed through serial communication with the AFEs are the same, and when the number of AFEs calculated through voltage measurement of the entire ESS and the number of AFEs confirmed through serial communication with the AFEs are the same, the number of AFEs is settled, and the number of battery packs is confirmed using this.

Meanwhile, it is possible to simply calculate the number of battery packs through only measurement of the voltage of the entire ESS, but in this case, there is a possibility that the number of battery packs may be incorrectly calculated due to a failure or error of the ESS.

In particular, in the case of the ESS, because of storing electrical energy, the ESS has a problem in that the voltage or current value measured using a voltage sensor or current sensor installed inside the ESS is not accurate.

In addition, the reason why the number of battery packs is calculated using the number of AFEs rather than the number of battery packs is that the number of battery packs is unable to be directly detected by the MCU because the battery packs are not directly connected to the MCU.

Meanwhile, when the number of AFEs confirmed using the voltage values of the entire ESS and the number of AFEs through serial communication are not the same, it is performed again from calculating the number of AFEs using the voltage values of the entire ESS.

Even after performing such a process again, when the number of AFEs confirmed using the voltage value of the entire ESS and the number of AFEs through serial communication are not the same, this implies that there is a problem with the output voltage of the ESS or a problem with the connection between the AFE and the MCU, so it may be determined in the end that there is a problem with the ESS.

That is, in the present disclosure, in addition to automatically detecting the number of battery packs, when the number of battery packs is not automatically detected, there is a problem with the ESS, so the present disclosure may also be used to detect failure or abnormality of the ESS.

In addition, the number of battery packs of the ESS may be automatically and accurately detected, and the number of battery packs of the ESS may be accurately known without disassembling the ESS, so various types of the ESSs may be manufactured.

In addition, the present disclosure may be used for detecting assembly errors, failures, or the like of the battery pack in a process of manufacturing the ESS.

Hereinafter, an apparatus for automatically detecting the number of battery packs in an ESS according to an exemplary embodiment of the present disclosure will be described with reference to FIG. 2.

Figure 2:
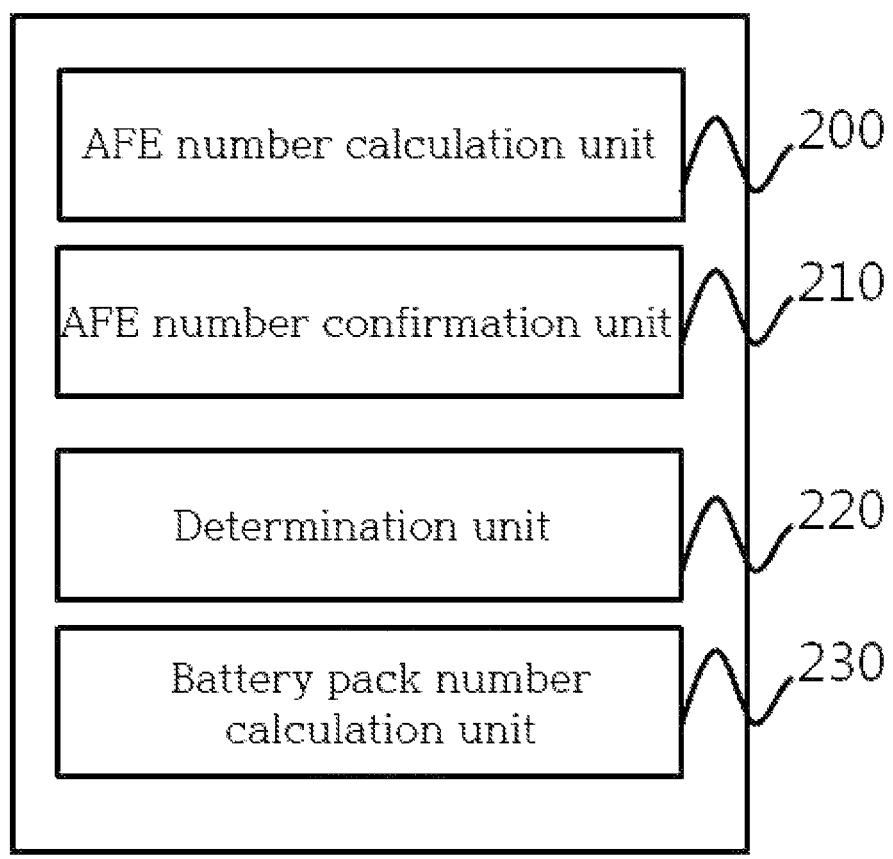
FIG. 2 is a diagram illustrating a configuration of an apparatus for automatically detecting the number of battery packs in the ESS according to the exemplary embodiment of the present disclosure.

FIG. 2 is a diagram illustrating a configuration of an apparatus for automatically detecting the number of battery packs in the ESS according to the exemplary embodiment of the present disclosure.

As described above, in the apparatus for automatically detecting the number of battery packs in the ESS according to the exemplary embodiment of the present disclosure, the MCU included in the ESS performs the function and corresponds to the apparatus for automatically detecting the number of battery packs in the ESS.

As shown in FIG. 2, the apparatus for automatically detecting the number of battery packs in the ESS according to the exemplary embodiment of the present disclosure may include an AFE number calculation unit 200, an AFE number confirmation unit 210, a determination unit 220, and a battery packs number calculation unit 230.

The AFE number calculation unit 200 calculates the number of analog front-ends (AFEs) through the measurement of the voltage of the entire ESS.

The calculating the number of AFEs is as described above, for example, when the output voltage of the measured ESS is 100 V and one battery pack is manufactured to output a voltage of 25 V, the number of battery packs is four, and when two AFEs are connected to each battery pack, this implies that the total number of AFEs is calculated as eight.

The AFE number confirmation unit 210 confirms the number of AFEs through serial communication with the AFEs.

As shown in the circuit example of the ESS, the AFE and MCU are connected through serial communication in the present disclosure, so confirming the number of AFEs is to confirm the number of AFEs using this.

The determination unit 220 determines whether the number of AFEs calculated by the AFE number calculation unit 200 and the number of AFEs confirmed by the AFE number confirmation unit 210 are the same.

When the number of AFEs calculated by the AFE number calculation unit 200 and the number of AFEs confirmed by the AFE number confirmation unit 210 are the same as the result of the determination by the determination unit 220, the battery pack number calculation unit 230 calculates the number of battery packs using the number of AFEs.

Meanwhile, when the number of AFEs calculated by the AFE number calculation unit 200 and the number of AFEs confirmed by the AFE number confirmation unit 210 are not the same as a result of the determination by the determination unit 220, it is performed again from calculating the number of AFEs through the voltage measurement of the entire ESS in the AFE number calculation unit 200.

That is, the voltage measurement of the entire ESS, the number of battery packs through such a measurement, and the number of AFEs according to the number of battery packs are recalculated.

In addition, when a result in the AFE number calculation unit 200 shows also that the number of AFEs calculated by the AFE number calculation unit 200 and the number of AFEs confirmed by the AFE number confirmation unit 210 are not the same, the determination unit 220 determines that the ESS is abnormal.

Meanwhile, the battery packs are interconnected in a daisy chain method, and the AFEs are each connected to each battery pack and perform at least one of voltage measuring of battery cells, temperature measuring of the battery cells, and cell balancing between the battery cells, the battery cells constituting the battery pack.

In addition, serial communication to which the AFE is connected may be a Serial Peripheral Interface (SPI) communication method.

Hereinafter, with reference to FIG. 3, a sequence that a method for automatically detecting the number of battery packs in an ESS according to an exemplary embodiment of the present disclosure is implemented will be described.

Figure 3:
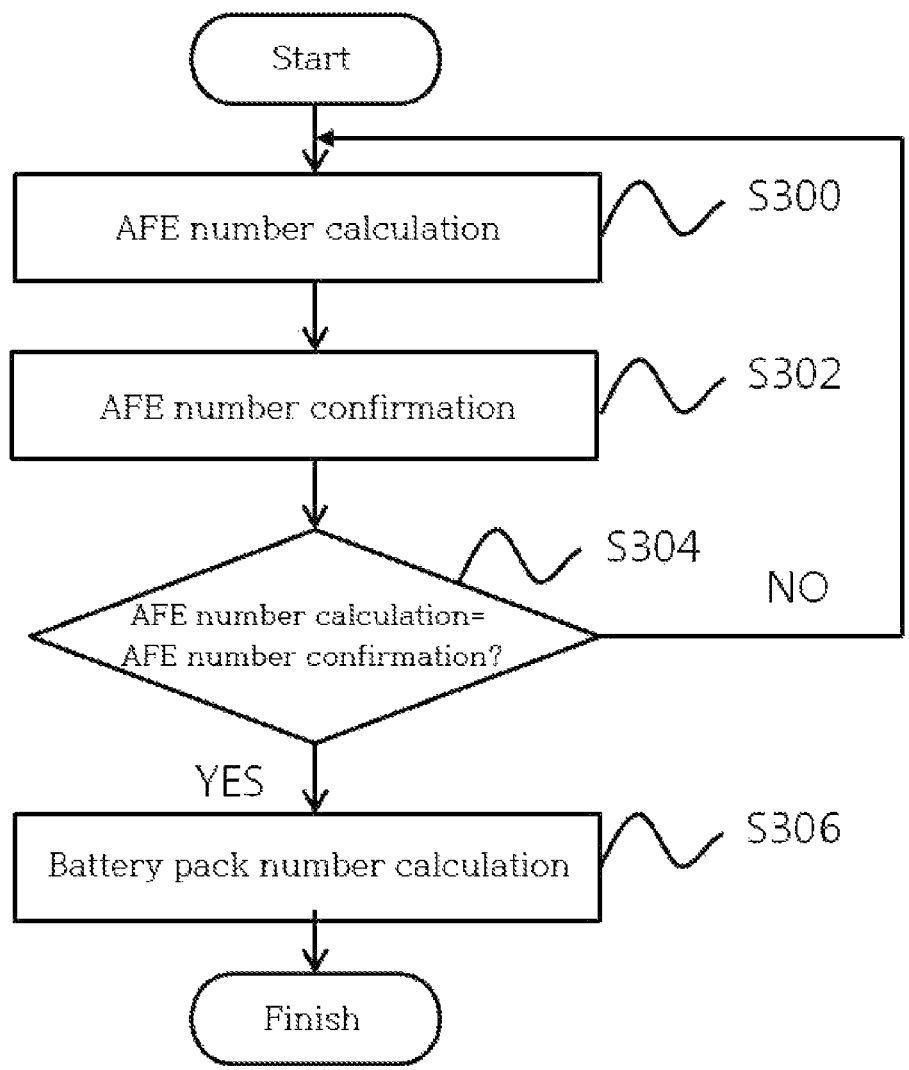
FIG. 3 is a flowchart illustrating a sequence that a method for automatically detecting the number of battery packs in the ESS according to an exemplary embodiment of the present disclosure is implemented.

FIG. 3 is a flowchart illustrating a sequence that a method for automatically detecting the number of battery packs in the ESS according to an exemplary embodiment of the present disclosure is implemented.

As shown in FIG. 3, the method for automatically detecting the number of battery packs of the ESS according to the exemplary embodiment of the present disclosure calculates the number of AFEs through measurement of voltage of the entire ESS first in S300.

As described above, the calculating of the number of AFEs implies that, for example, when the output voltage of the measured ESS is 100 V and one battery pack is manufactured to output a voltage of 25 V, the number of battery packs is calculated as four, and when each battery pack has two AFEs connected thereto, the total number of AFEs is calculated as eight.

Next, the number of AFEs is confirmed through serial communication with the AFEs in S302.

As shown in a circuit example of the ESS described above to which the present disclosure is applied, the AFE and MCU are connected through serial communication in the present disclosure, so the number of AFEs is confirmed using this.

In addition, it is determined whether the calculated number of AFEs and the confirmed number of AFEs are the same in S304.

As a result of the determination, when the calculated number of AFEs and the confirmed number of AFEs are the same, the number of battery packs is calculated using the number of AFEs in S306.

When the calculated number of AFEs and the confirmed number of AFEs are not the same, a process starts again from calculating the number of AFEs.

That is, the voltage measurement of the entire ESS and the number of battery packs through such a measurement, and the number of AFEs according to the number of battery packs are recalculated.

On the other hand, although not shown in FIG. 3, when the calculated number of AFEs and the confirmed number of AFEs are not the same even in the result performed again from calculating the number of AFEs through the voltage measurement of the entire ESS, it may be determined that the ESS is abnormal.

In addition, when it is determined that the ESS is abnormal, it will be possible to allow abnormality of the ESS to be known and the ESS to be inspected in various ways such as notification of ESS inspection using MCU.

Meanwhile, the battery packs are interconnected in a daisy chain method; the AFEs are each connected to each battery pack and perform at least one of voltage measuring of battery cells, temperature measuring of the battery cells, and cell balancing between the battery cells, cell balancing between the battery cells; and serial communication to which the AFE is connected may be a Serial Peripheral Interface (SPI) communication method as described above.

It is obvious that the method for automatically detecting the number of battery packs according to the present disclosure may be installed and performed in a form of firmware in an MCU.

In addition, the present disclosure may not only allow the number of battery packs to be automatically detected but also be used to detect failure or abnormality of the ESS because there is a problem with the ESS when the number of battery packs is not automatically detected.

In addition, the number of battery packs of the ESS can be automatically and accurately detected, and the number of battery packs of the ESS may be accurately known even without disassembling the ESS, so various types of the ESSs may be manufactured.

The exemplary embodiments of the present disclosure described above have been disclosed for illustrative purposes, and those skilled in the art with ordinary knowledge of the present disclosure will be able to make various modifications, changes, and additions within the spirit and scope of the present disclosure, and such modifications, changes, and additions should be considered to fall within the scope of the following claims.

What is claimed is:

1. A method for automatically detecting the number of battery packs performed by a micro control unit (MCU) included in an energy storage system (ESS), the method comprising:
    calculating the number of analog front-ends (AFEs) through measurement of voltage of an entire ESS;
    confirming the number of AFEs using serial communication with the AFEs;
    determining whether the number of AFEs calculated through the measurement of voltage of the entire ESS and the number of AFEs determined through the serial communication with the AFEs are the same; and
    when the number of AFEs calculated through the measurement of voltage of the entire ESS and the number of AFEs confirmed through the serial communication with the AFEs are the same, calculating the number of battery packs using the number of AFEs.

2. The method of claim 1, wherein, when the number of AFEs calculated through the measurement of voltage of the entire ESS and the number of AFEs confirmed through the serial communication with the AFEs are not the same, it is performed again from a step of calculating the number of AFEs through the measurement of voltage of the entire ESS.

3. The method of claim 2, wherein, when a result of a process performed again from the step of calculating the number of AFEs through the measurement of voltage of the entire ESS shows also that the number of AFEs calculated through voltage measurement of the entire ESS and the number of AFEs confirmed through the serial communication with the AFEs are not the same, it is determined that the ESS is abnormal.

4. The method of claim 1, wherein the battery packs are interconnected in a daisy chain method.

5. The method of claim 1, wherein the AFEs are each connected to each battery pack and perform at least one of voltage measuring of battery cells, temperature measuring of the battery cells, and output balancing between the battery cells, the battery cells constituting the battery pack.

6. The method of claim 1, wherein the serial communication in which the MCU and the AFEs are connected is a serial peripheral interface (SPI) communication method.

7. An apparatus for automatically detecting the number of battery packs in an ESS, the apparatus comprising:
    an AFE number calculation unit configured to calculate the number of analog front-ends (AFEs) through voltage measurement of voltage of an entire ESS;
    an AFE number confirmation unit configured to confirm the number of AFEs through serial communication with the AFEs;
    a determination unit configured to determine whether the number of AFEs calculated by the AFE number calculation unit and the number of AFEs confirmed by the AFE number confirmation unit are the same; and
    a battery pack number calculation unit configured to calculate the number of battery packs using the number of AFEs when the number calculated by the AFE number calculation unit and the number confirmed by the AFE number confirmation unit are the same, as the result of the determination by the determination unit.

8. The apparatus of claim 7, wherein, when the number of AFEs calculated by the AFE number calculation unit and the number of AFEs confirmed by the AFE number confirmation unit are not the same, as a result of the determination by the determination unit, it is performed again from calculating the number of AFEs through the voltage measurement of the entire ESS in the AFE number calculation unit.

9. The apparatus of claim 8, wherein, when a result of performing again from the calculating the number of AFEs through the voltage measurement of the entire ESS in the AFE number calculation unit shows also that the number of AFEs calculated by the AFE number calculation unit and the number of AFEs confirmed by the AFE number confirmation unit are not the same, the determination unit determines that the ESS is abnormal.

10. The apparatus of claim 7, wherein the battery packs are interconnected in a daisy chain method.

11. The apparatus of claim 7, wherein the AFEs are each connected to each battery pack and perform at least one of voltage measuring of battery cells, temperature measuring of the battery cells, and output balancing between the battery cells, the battery cells constituting the battery pack.

12. The apparatus of claim 7, wherein the serial communication to which the AFEs are connected is a serial peripheral interface (SPI) communication method.

* * * * *